United States Patent
He et al.

(10) Patent No.: US 11,611,273 B2
(45) Date of Patent: Mar. 21, 2023

(54) DETECTION OF POWER SUPPLY CIRCUIT IRREGULARITIES

(71) Applicant: Analog Devices International Unlimited Company, Limerick (IE)

(72) Inventors: Jie He, Shanghai (CN); Tao Lin, Shanghai (CN); Langyuan Wang, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/342,056

(22) Filed: Jun. 8, 2021

(65) Prior Publication Data
US 2021/0391780 A1 Dec. 16, 2021

Related U.S. Application Data (60) Provisional application No. 63/039,658, filed on Jun. 16, 2020.

(51) Int. Cl.
*H02M 1/00* (2006.01)
*G01R 23/165* (2006.01)

(52) U.S. Cl.
CPC .............................. *H02M 1/0003* (2021.05)

(58) Field of Classification Search
CPC .. G01R 23/165; H02M 1/0022; H02M 1/0019
See application file for complete search history.

(56) References Cited

U.S. PATENT DOCUMENTS

| | | | |
|---|---|---|---|
| 9,178,415 B1 * | 11/2015 | Kost | H02M 3/157 |
| 2010/0177538 A1 * | 7/2010 | Scherr | G01R 31/28 |
| | | | 363/39 |
| 2016/0126825 A1 * | 5/2016 | Huang | H02M 1/44 |
| | | | 363/46 |
| 2017/0336448 A1 * | 11/2017 | Jang | G01R 31/42 |

FOREIGN PATENT DOCUMENTS

| | | | | |
|---|---|---|---|---|
| JP | 3796559 B1 * | 7/2022 | | |
| WO | WO-2019039638 A1 * | 2/2019 | | B60L 3/003 |
| WO | 2021255109 | 12/2021 | | |
| WO | WO-2021255109 A1 * | 12/2021 | | H02M 1/0003 |

* cited by examiner

*Primary Examiner* — Sisay G Tiku
(74) *Attorney, Agent, or Firm* — Schwegman Lundberg & Woessner, P.A.

(57) ABSTRACT

Embodiments of the present disclosure describe frequency detection techniques for detecting power irregularities. These irregularities may include variations or abnormalities in switched-mode power supply circuit switching behavior, power spikes, and/or output oscillations. The frequency detection techniques may compare different frequency components of the power signal to detect irregularities.

20 Claims, 10 Drawing Sheets

DETECTION OF POWER SUPPLY CIRCUIT IRREGULARITIES

CLAIMS OF PRIORITY

This patent application claims the benefit of priority U.S. Provisional Patent Application Ser. No. 63/039,658, titled "DETECTION OF POWER SUPPLY CIRCUIT IRREGULARITIES," filed on Jun. 16, 2020, which is hereby incorporated by reference herein in its entirety.

TECHNICAL FIELD

The present disclosure generally relates to detection of power supply circuit irregularities and failures, such as variations or abnormalities in switched-mode power supply circuit switching behavior, power spikes, and/or output oscillations.

BACKGROUND

In recent times, electronic sensors have been integrated in numerous components across different industries ranging from healthcare to industrial equipment. In an automobile, for example, sensors may be included in headlights, engine management, airbag deployment, rear lights, rear view camera, brake lights, antilock braking, active suspension, vision, electric power steering, and so forth. These electronic sensors and other electronic components are supplied power by regulator circuits that condition power from the vehicle battery or alternator. Such regulator circuits may generally be referred to as power supplies.

But these power supplies may generate irregularities, such as switching frequency/output voltage drift, unstable oscillation, under/over voltage, and spikes. These irregularities can adversely impact the operation of the electronic components. Thus, there is a need to detect such power irregularities. For industrial and automotive applications, safety regulations (e.g., ISO 26262, Automotive Safety Integrity Level (ASIL/SIL))) concern functional safety of electronic systems.

Some techniques to detect power irregularities may involve intensive digital signal processing capabilities, increasing complexity and costs. For example, some techniques involve using an autocovariance function applied to a signal corresponding to a specified time duration to detect certain irregularities, such as by monitoring an output voltage or other signal corresponding thereto. Not only does this technique generally involve use of a complex digital signal processor, but it also relies on the accuracy of a model defining the autocovariance function. Some other techniques involve sampling a signal, such as an output signal from the supply, using a high accuracy analog-to-digital converter (ADC) to extract frequency information; but these techniques suffer the same drawbacks of being overly complex and too costly. Moreover, use of an ADC for such sampling can cause additional noise in the sampled signal, confounding such monitoring or analysis.

BRIEF DESCRIPTION OF THE DRAWINGS

Various ones of the appended drawings merely illustrate example embodiments of the present disclosure and should not be considered as limiting its scope.

DETAILED DESCRIPTION

The present inventors recognized, among other things, a need for low-cost, simple techniques for detecting power irregularities. The frequency detection techniques described herein may detect power irregularities, such as variations or abnormalities in switched-mode power supply circuit switching behavior, power spikes, and/or output oscillations, in a simple manner without using complex processing or conversion processes. The frequency detection techniques may compare different frequency components of the power signal to detect irregularities.

This document describes a detector circuit for monitoring a power supply circuit output. The detector circuit may include a first configurable filter to extract a first component of an input signal corresponding to a first range of frequencies and a second configurable filter to extract a second component of the input signal corresponding to a second range of frequencies, the second range of frequencies extending to frequencies higher than the first range of frequencies. The detector circuit may also include a comparator to compare the first and second components to generate a comparator output. The detector circuit may further include a digital circuit to generate a value representative of a detected frequency of the input signal based on crossings detected at the comparator output.

This document also describes a method comprising: extracting a first component of an input signal; extracting an second component of the input signal; detecting one or more crossings of the first and second components; and based on the one or more crossings, calculating a value representative of detected frequency of the input signal.

This document further describes a method comprising: filtering a first component of an input signal, wherein the first component includes a DC or near-DC portion of the input signal; filtering a second component of the input signal; comparing the first and second components; based on comparing the first and second components, determining an irregularity of the input signal.

Figure 1:
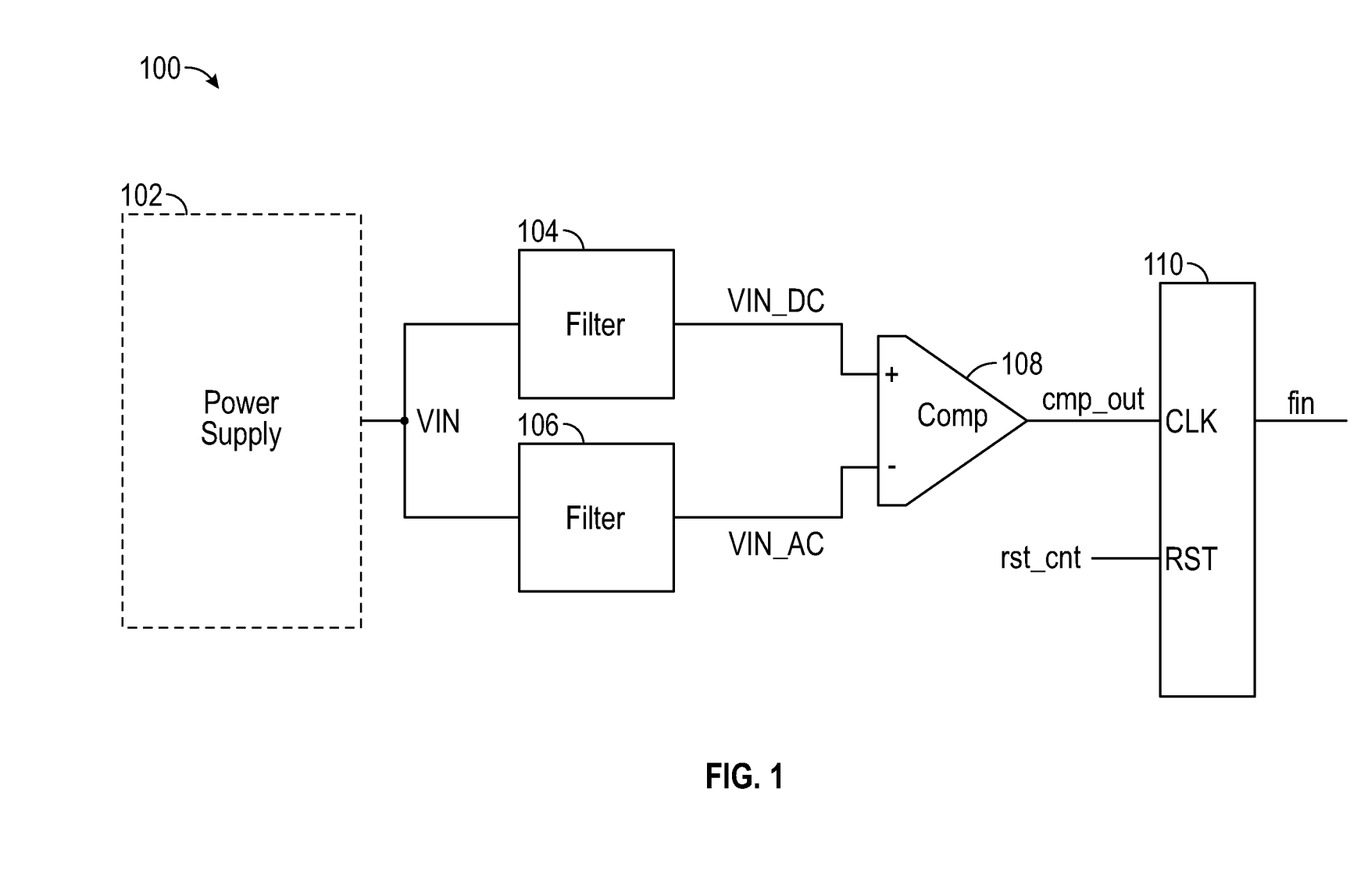
FIG. 1 illustrates a block diagram of an example portion of a frequency detection system.

FIG. 1 illustrates a block diagram of an example portion of a frequency detection system 100. The frequency detection system 100 may include a power supply circuit 102, a first configurable filter 104, a second configurable filter 106, a comparator 108, and a digital circuit 110. The power supply circuit 102 may generate an input signal (VIN) to power electronic components. The input signal may include irregularities, as described herein.

The power supply circuit 102 may be coupled to the first and second configurable filters 104, 106. The first configurable filter 104 may extract a direct-current (DC) or near-DC component (VIN_DC) (i.e., first range of frequencies) of the input signal. The first configurable filter 104 may be implemented as a passive or active filter. For example, the first configurable filter 104 may be provided as a RC filter.

The second configurable filter 106 may extract a specified frequency range of an alternating-current (AC) component (VIN_AC) (i.e., second range of frequencies) of the input signal. The cut-off frequency of the second configurable filter 106 may be programmed to select the specified frequency range, and the specified frequency range (e.g., a pass band) of the second configurable filter 106 may encompass a range of frequencies different from a corresponding passband of the first configurable filter 104. The second configurable filter 106 may be implemented as a passive or active filter. For example, the second configurable filter 106 may be provided as a butterworth filter. The second configurable filter 106 may also operate as an amplifier or otherwise provide a gain greater in magnitude than unity for a portion or an entirety of the AC component when desired. The gain of the second configurable filter 106 may be adjustable.

The comparator 108 may be coupled to the outputs of the first and second configurable filters 104, 106. The comparator 108 may compare the extracted DC component or near-DC component (VIN_DC) and the extracted AC component (VIN_AC) to generate a comparator output. The comparator 108 may operate as a signal crossing detector, such as a zero-cross detector. That is, the comparator 108 may detect the crossings of the DC and AC components. The output of the comparator 108 may go high at crossing detections of the DC and AC components.

The digital circuit 110 may be coupled to the output of the comparator 108. The digital circuit 110 may include a counter and other digital logic circuitry (e.g., flip flops and/or gate structures). The digital circuit 110 may receive the comparator output (cmp_out) at a clock input. The digital circuit 110 may count the number of zero crossings (NZC) in a time interval (T). The time interval may be set by a reset control signal (rst_cnt) at a RST input. For example, the time interval may be the time between two reset control signals. The digital circuit 110 may generate a value representative of a detected frequency (fin) of the input signal:

$$\text{fin} = \frac{N_{zc}}{T}$$

The detected frequency fin may provide useful frequency information about the input signal. For example, the detected frequency may provide information about the switching frequency, oscillation (due to unstable conditions), spikes, load transient, etc., of the power supply circuit 102. Moreover, the frequency of the input signal may be detected without using complex ADC and digital signal processing techniques (e.g., FFT, autocovariance function, etc.).

Next, different configurations of the frequency detection system are described; each configuration may be tuned or configured to detect one or more power irregularity.

Figure 2:
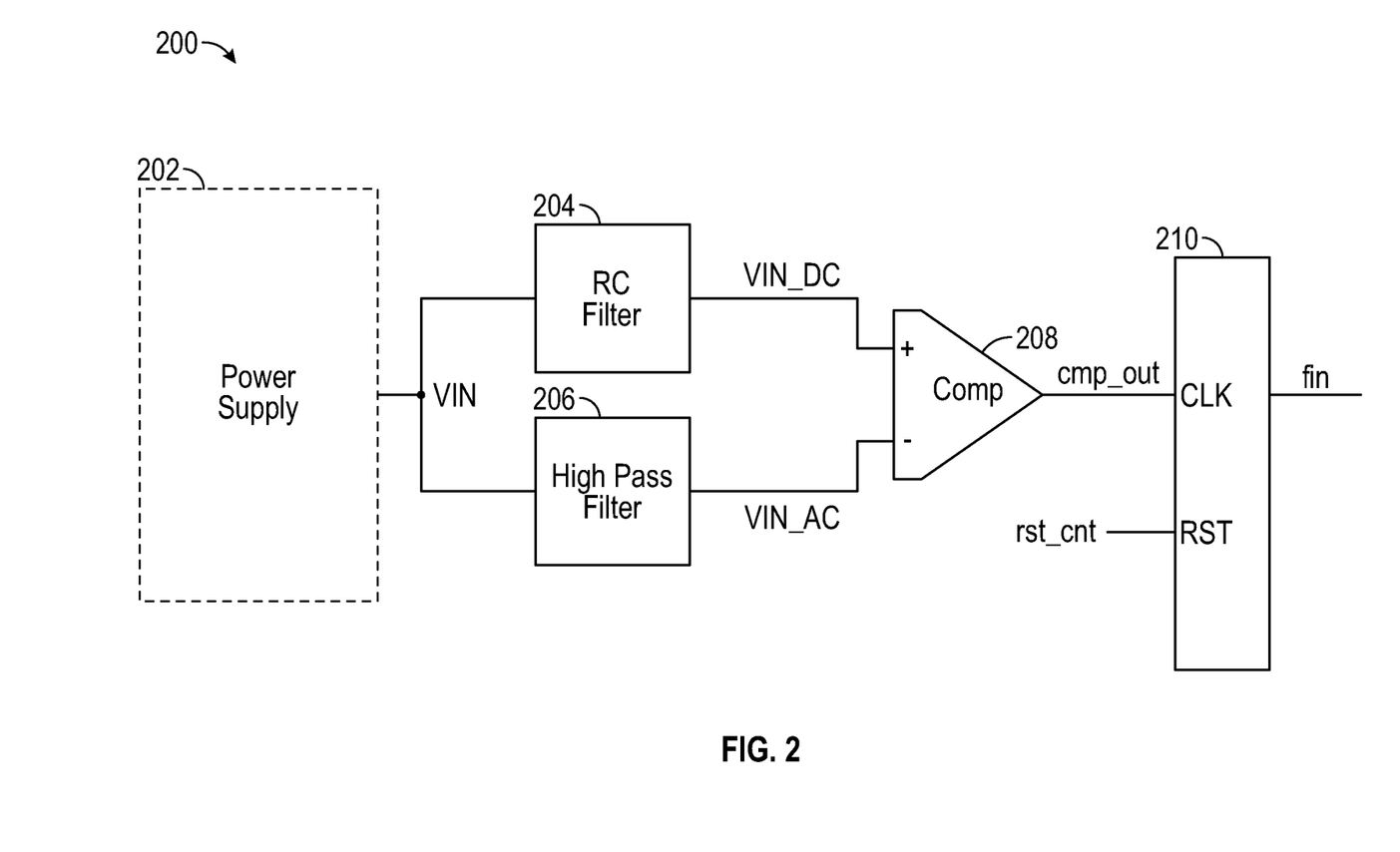
FIG. 2 illustrates a block diagram of an example portion of a frequency detection system to detect switch frequency of a power supply circuit.

FIG. 2 illustrates a block diagram of an example portion of a frequency detection system 200 to detect switch frequency of a power supply circuit. The input signal generated by the power supply circuit may contain small ripples at the switching frequency of the power supply circuit. Based on this ripple, the system 200 may detect the switching frequency of the power supply circuit. The system 200 may include a power supply circuit 202, a first configurable filter 204, a second configurable filter 206, a comparator 208, and a digital circuit 210. The power supply circuit 202 may generate an input signal (VIN) to power electronic components. The power supply circuit 202 may be coupled to the first and second configurable filters 204, 206. The first configurable filter 204 may extract a direct-current (DC) or near-DC component (VIN_DC) (i.e., first range of frequencies) of the input signal. The first configurable filter 204 may be implemented as a passive or active filter. In this example, the first configurable filter 204 may be provided as RC filter with a specified cut of frequency (e.g., 2 KHz).

The second configurable filter 206 may extract a specified frequency range of an AC component (VIN_AC) of the input signal, as described above with reference to FIG. 1 (e.g., with respect to second configurable filter 106). In this example, the second configurable filter 206 may be implemented as a butterworth high pass filter (e.g., $5^{th}$ order) to extract a high frequency AC component of the input signal. For example, the cut-off frequency may be 1 MHz. An AC gain may also be set (e.g., 5).

The comparator 208 may be coupled to the outputs of the first and second configurable filters 204, 206. The comparator 208 may compare the extracted DC component or near-DC component (VIN_DC) and the extracted AC component (VIN_AC) to generate a comparator output. The comparator 208 may operate as a signal crossing detector, such as a zero-cross detector. That is, the comparator 208 may detect the crossings of the DC and AC components. The output of the comparator 208 may go high at crossing detections of the DC and AC components.

The digital circuit 210 may be coupled to the output of the comparator 208. The digital circuit 210 may include a counter and other digital logic circuitry (e.g., flip flops and/or gate structures). The digital circuit 220 may receive the comparator output (cmp_out) at a clock input. The digital circuit 210 may count the number of zero crossings (NZC) in a time interval (T). The time interval may be set by a reset control signal (rst_cnt) at a RST input. For example, the time interval may be the time between two reset control signals. The digital circuit 210 may generate a value representative of a detected frequency (fin) of the input signal:

$$\text{fin} = \frac{N_{zc}}{T}$$

The detected frequency here is indicative of the switching frequency because of the comparison of the high frequency AC component and the DC component. As described herein, the high frequency AC component typically contains the switching frequency.

Figure 3:
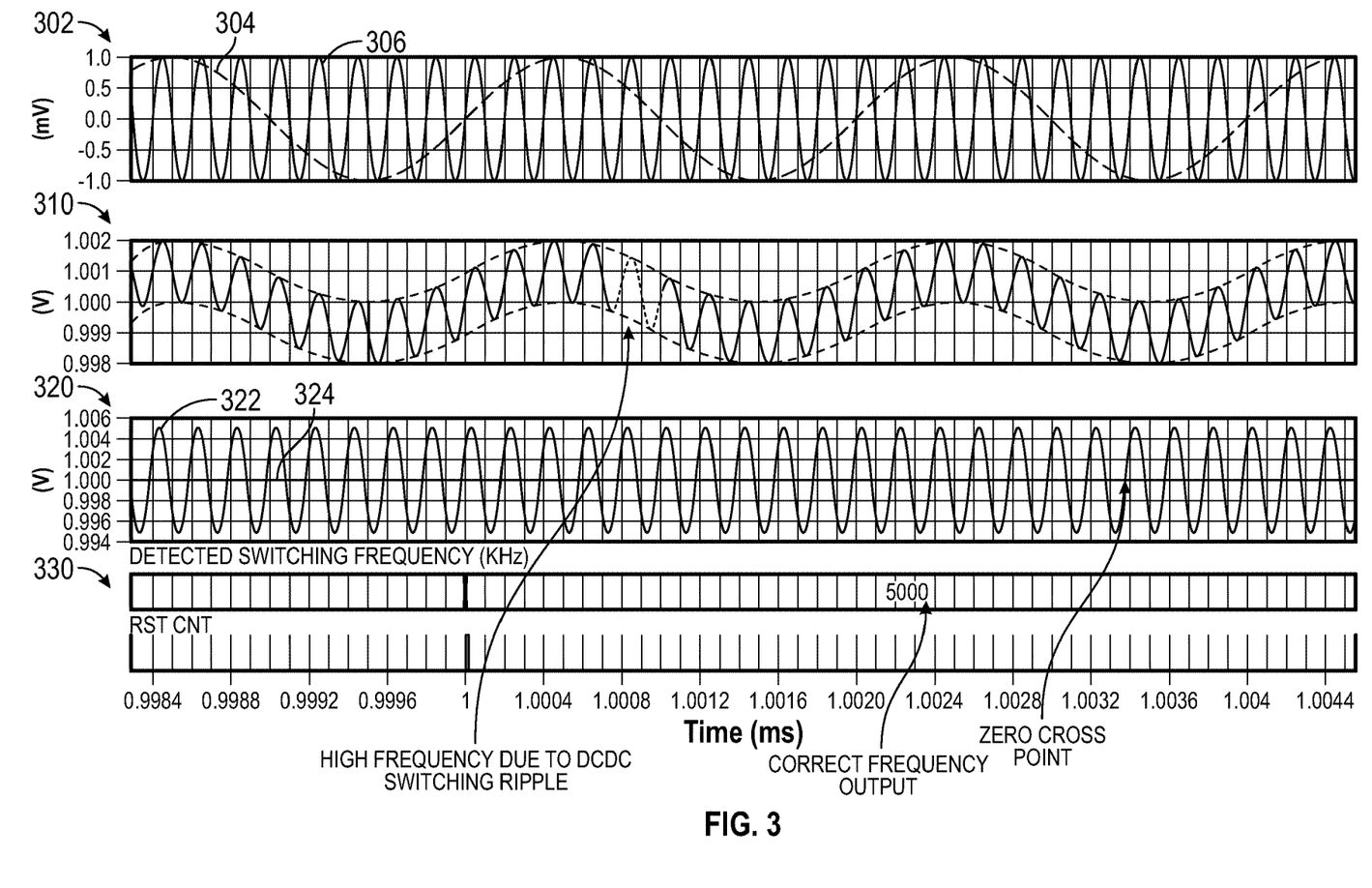
FIG. 3 illustrates example waveforms for detecting switch frequency of a power supply circuit.

FIG. 3 illustrates example waveforms associated with system 200 of FIG. 2 configured to detect switch frequency of a power supply circuit. Graph 302 shows the input signal (VIN) with the low frequency component 304 and the high frequency component 306. Graph 310 shows the low and high frequency components with the DC component of the input signal. Graph 320 shows the outputs of the first and second configurable filters (204, 206). Waveform 322 represents the high frequency component (VIN_AC) and waveform 324 represents the DC or near-DC component (VIN_DC). Graph 330 shows the calculation of detecting switching frequency as a function of number of zero crossings and the specified time interval.

Figure 4:
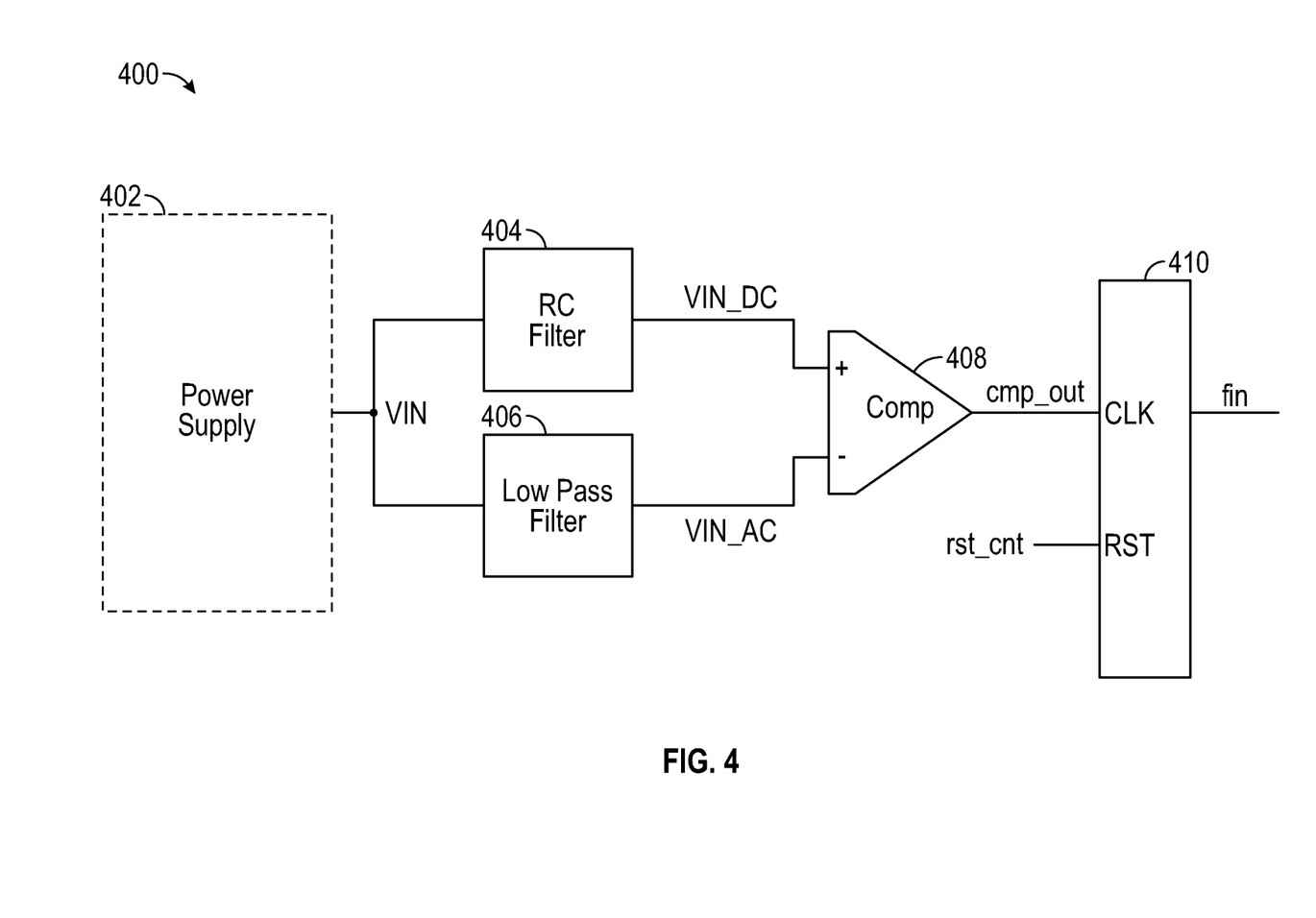
FIG. 4 illustrates a block diagram of an example portion of a frequency detection system to detect oscillations of a power supply circuit.

FIG. 4 illustrates a block diagram of an example portion of a frequency detection system 400 to detect oscillations of a power supply circuit. The power supply circuit may include a low-frequency oscillation due to a sub-harmonic oscillation, lack of sufficient phase margin, etc. The system 400 may detect this low-frequency oscillation of the power supply circuit. The system 400 may include a power supply circuit 402, a first configurable filter 404, a second configurable filter 406, a comparator 408, and a digital circuit 410. The power supply circuit 402 may generate an input signal (VIN) to power electronic components. The power supply circuit 402 may be coupled to the first and second configurable filters 404, 406. The first configurable filter 404 may extract a direct-current (DC) or near-DC component (VIN_DC) (i.e., first range of frequencies) of the input signal. The first configurable filter 404 may be implemented as a passive or active filter. In this example, the first configurable filter 404 may be provided as RC filter with a specified cut of frequency (e.g., 2 KHz).

The second configurable filter 406 may extract a specified frequency range of an AC component (VIN_AC) of the input signal, as described above with reference to FIG. 1 (e.g., with respect to second configurable filter 106). In this example, the second configurable filter 206 may be implemented as a butterworth low pass filter (e.g., $5^{th}$ order) to extract a low frequency AC component of the input signal. For example, the cut-off frequency may be 1 MHz. An AC gain may also be set (e.g., 5).

The comparator 408 may be coupled to the outputs of the first and second configurable filters 404, 406. The comparator 408 may compare the extracted DC component or near-DC component (VIN_DC) and the extracted AC component (VIN_AC) to generate a comparator output. The comparator 408 may operate as a signal crossing detector, such as a zero-cross detector. That is, the comparator 408 may detect the crossings of the DC and AC components. The output of the comparator 408 may go high at crossing detections of the DC and AC components.

The digital circuit 410 may be coupled to the output of the comparator 408. The digital circuit 410 may include a counter and other digital logic circuitry (e.g., flip flops and/or gate structures). The digital circuit 420 may receive the comparator output (cmp_out) at a clock input. The digital circuit 410 may count the number of zero crossings (NZC) in a time interval (T). The time interval may be set by a reset control signal (rst_cnt) at a RST input. For example, the time interval may be the time between two reset control signals. The digital circuit 410 may generate a value representative of a detected frequency (fin) of the input signal:

$$\text{fin} = \frac{N_{ZC}}{T}$$

The detected frequency here is indicative of the oscillation frequency because of the comparison of the low frequency AC component and the DC component. The low frequency AC component is indicative of the oscillations in the power supply circuit.

Figure 5:
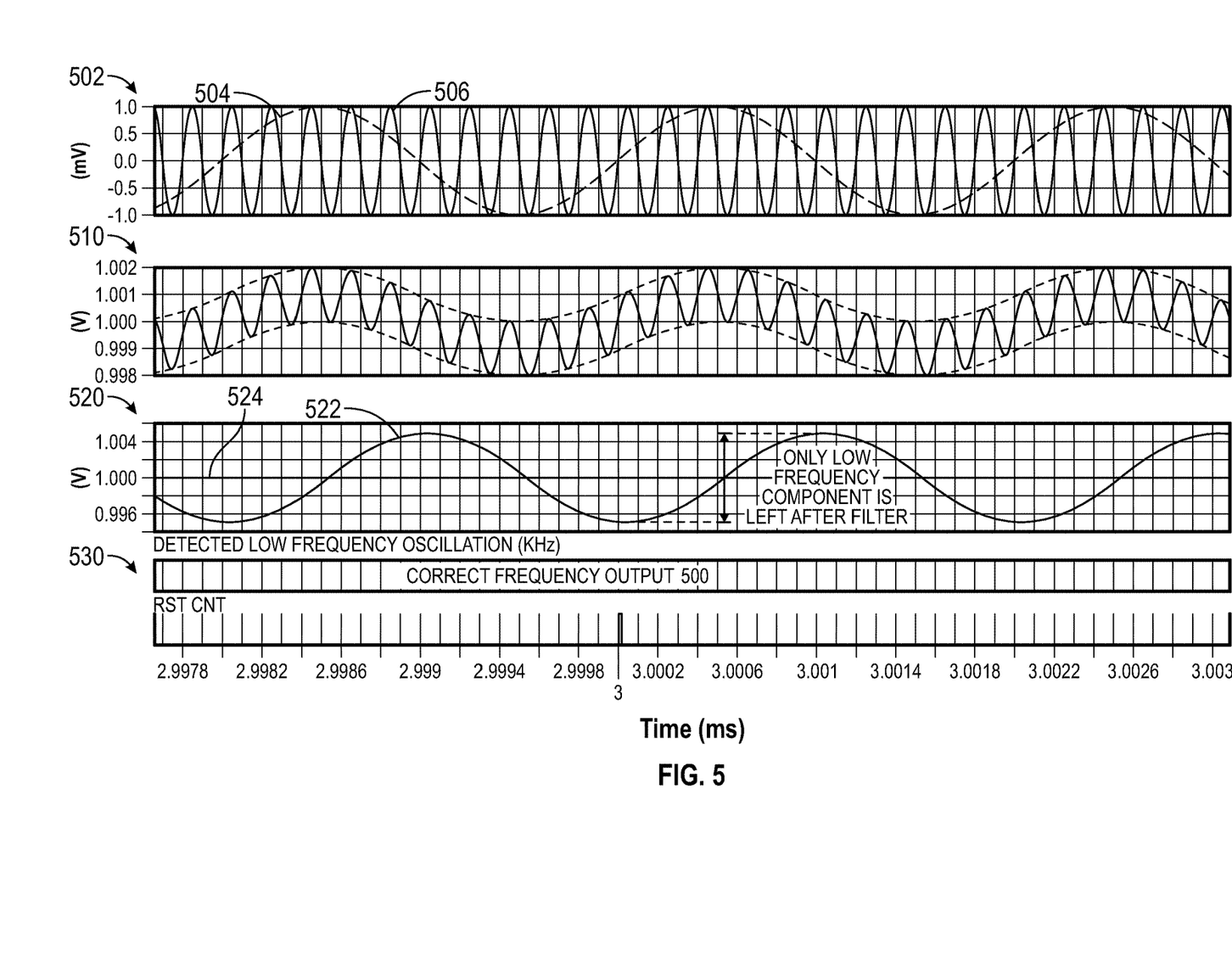
FIG. 5 illustrates example waveforms for detecting oscillations of a power supply circuit.

FIG. 5 illustrates example waveforms associated with system 400 of FIG. 4 configured to detect oscillations of a power supply circuit. Graph 502 shows the input signal (VIN) with the low frequency component 504 and the high frequency component 506. Graph 510 shows the low and high frequency components with the DC component of the input signal. Graph 520 shows the outputs of the first and second configurable filters (404, 406). Waveform 522 represents the low frequency AC component (VIN_AC) and waveform 524 represents the DC or near-DC component (VIN_DC). Graph 530 shows the calculation of detecting switching frequency as a function of number of zero crossings and the specified time interval.

Figure 6:
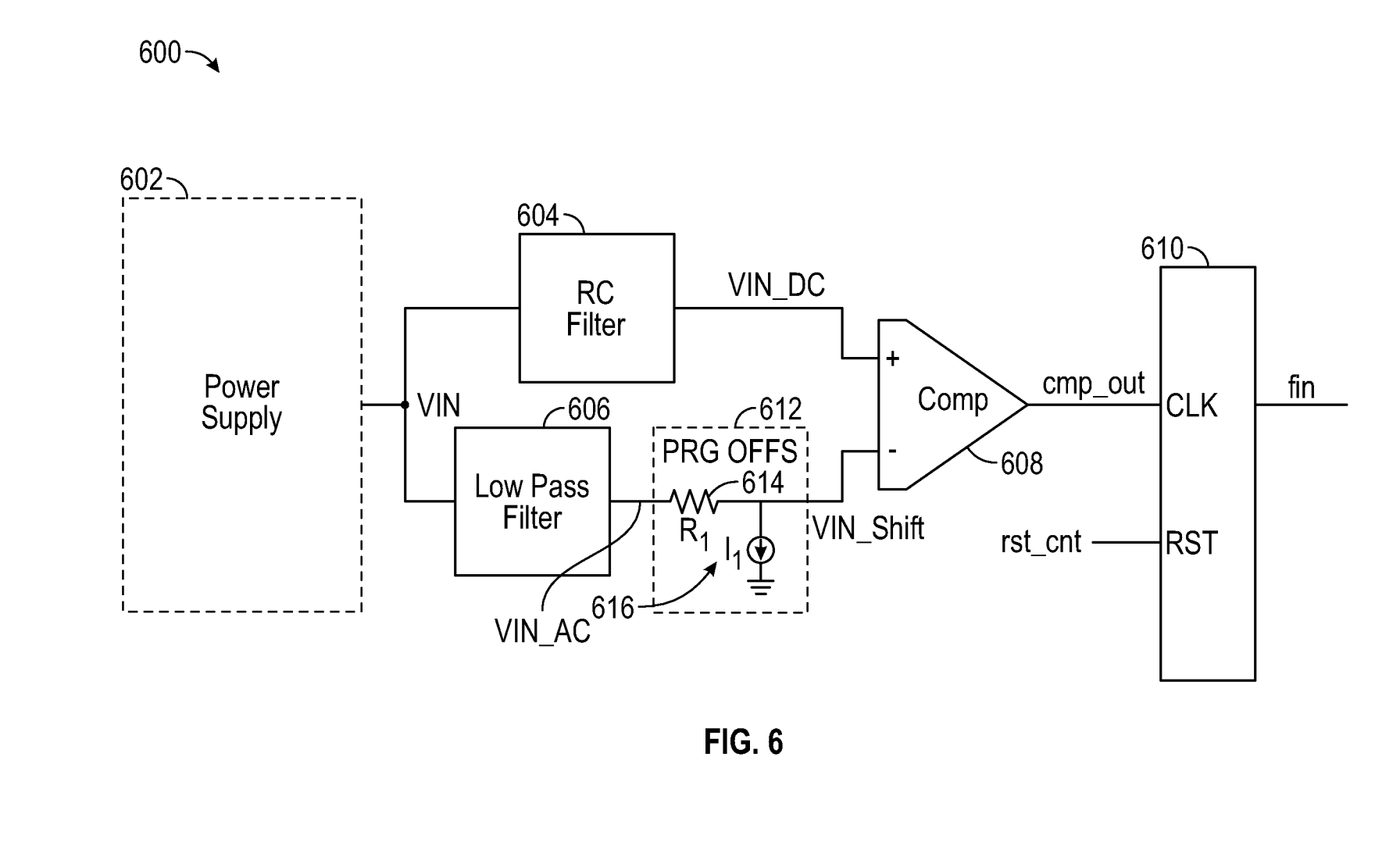
FIG. 6 illustrates a block diagram of an example portion of a frequency detection system to detect ripples of a power supply circuit.

FIG. 6 illustrates a block diagram of an example portion of a frequency detection system 600 to detect ripples of a power supply circuit. The power supply circuit may generate ripples in the input signal. If the ripples become too large, they may degrade component performance (e.g., RF circuit, ADC, etc.). The system 600 may detect ripple amplitude of the power supply circuit. The system 600 may include a power supply circuit 602, a first configurable filter 604, a second configurable filter 606, a comparator 608, a digital circuit 610, and a programmable offset generator 612. The power supply circuit 402 may generate an input signal (VIN) to power electronic components.

The power supply circuit 602 may be coupled to the first and second configurable filters 604, 606. The first configurable filter 604 may extract a direct-current (DC) or near-DC component (VIN_DC) (i.e., first range of frequencies) of the input signal. The first configurable filter 604 may be implemented as a passive or active filter. In this example, the first configurable filter 604 may be provided as RC filter with a specified cut of frequency (e.g., 2 KHz).

The second configurable filter 606 may extract a specified frequency range of an AC component (VIN_AC) of the input signal, as described above with reference to FIG. 1 (e.g., with respect to second configurable filter 106). In this example, the second configurable filter 606 may be implemented as a butterworth low pass filter (e.g., $5^{th}$ order) to extract a low frequency AC component of the input signal. For example, the cut-off frequency may be 1 MHz. An AC gain may also be set (e.g., 5).

The output of the second configurable filter 606 may be coupled to the programmable offset generator 612. The programmable offset generator 612 may shift the extracted AC component (VIN_AC) to generate a shifted signal (VIN_Shift). For example, the programmable offset generator 612 may include a resistor (R1) 614 and a programmable current digital-to-analog converter (IDAC I1) 616. The shifted signal may be represented as:

$$VIN_{Shift} = VIN_{AC} - (R1 \times I1)$$

The comparator 608 may be coupled to the outputs of the first configurable filters 604 and the programmable offset generator 612. The comparator 608 may compare the extracted DC component (VIN_DC) and the shifted extracted AC component (VIN_Shift) to generate a comparator output. The comparator 608 may operate as signal cross detector, such as a zero cross detector. That is, the comparator may detect the crossings of the DC and shifted AC components. The comparator output may go high at the crossing detection. Here, because of the shift, the comparator output may go high when the voltage ripple is larger than:

$$\frac{R1/1}{G},$$

where G is the AC gain (e.g., 5).

The digital circuit 610 may be coupled to the output of the comparator 608. The digital circuit 610 may include a counter and other digital logic circuitry (e.g., flip flops and/or gate structures). The digital circuit 620 may receive the comparator output (cmp_out) at a clock input. The digital circuit 610 may count the number of zero crossings (NZC) in a time interval (T). The time interval may be set by a reset control signal (rst_cnt) at a RST input. For example, the time interval may be the time between two reset control signals. The digital circuit 610 may generate a value representative of a detected frequency (fin) of the input signal:

$$\text{fin} = \frac{N_{ZC}}{T}$$

The detected frequency here is indicative of the amplitude of the ripple voltage.

Figure 7:
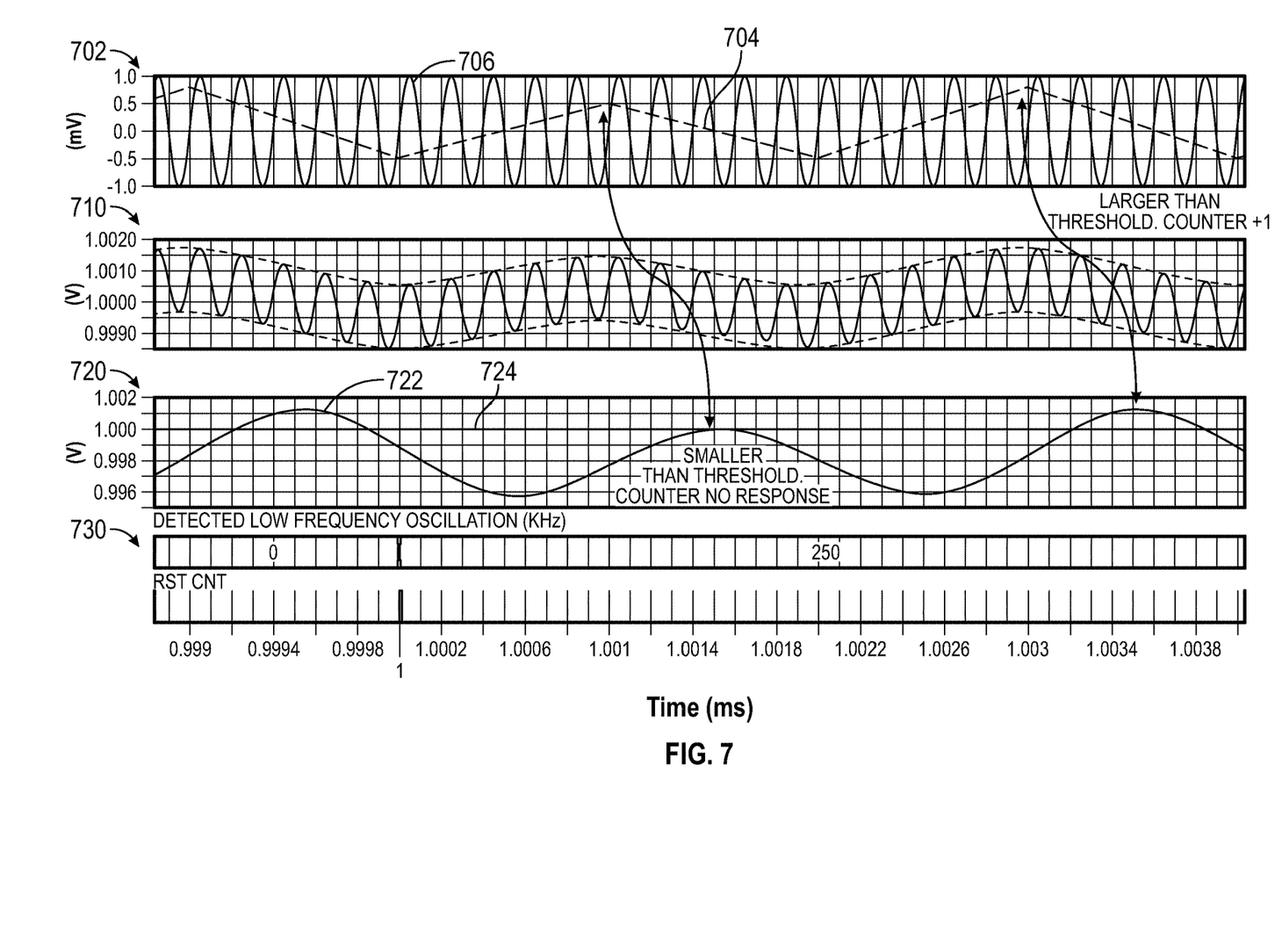
FIG. 7 illustrates example waveforms for detecting ripples of a power supply circuit.

FIG. 7 illustrates example waveforms associated with system 600 of FIG. 6 configured to detect ripples of a power supply circuit. Graph 702 shows the input signal (VIN) with the low frequency component 704 and the high frequency component 706. Graph 710 shows the low and high frequency components with the DC component of the input signal. Graph 720 shows the outputs of the first configurable filter and programmable offset generator (604, 612). Waveform 722 represents the shifted low frequency AC component (VIN_Shift) and waveform 724 represents the DC or near-DC component (VIN_DC). As shown, small ripples (those below the DC component reference line) may not be counted, but larger ripples (those above the DC component reference line) may be counted. Graph 730 shows the calculation of detecting switching frequency as a function of number of zero crossings and the specified time interval.

Figure 8A:
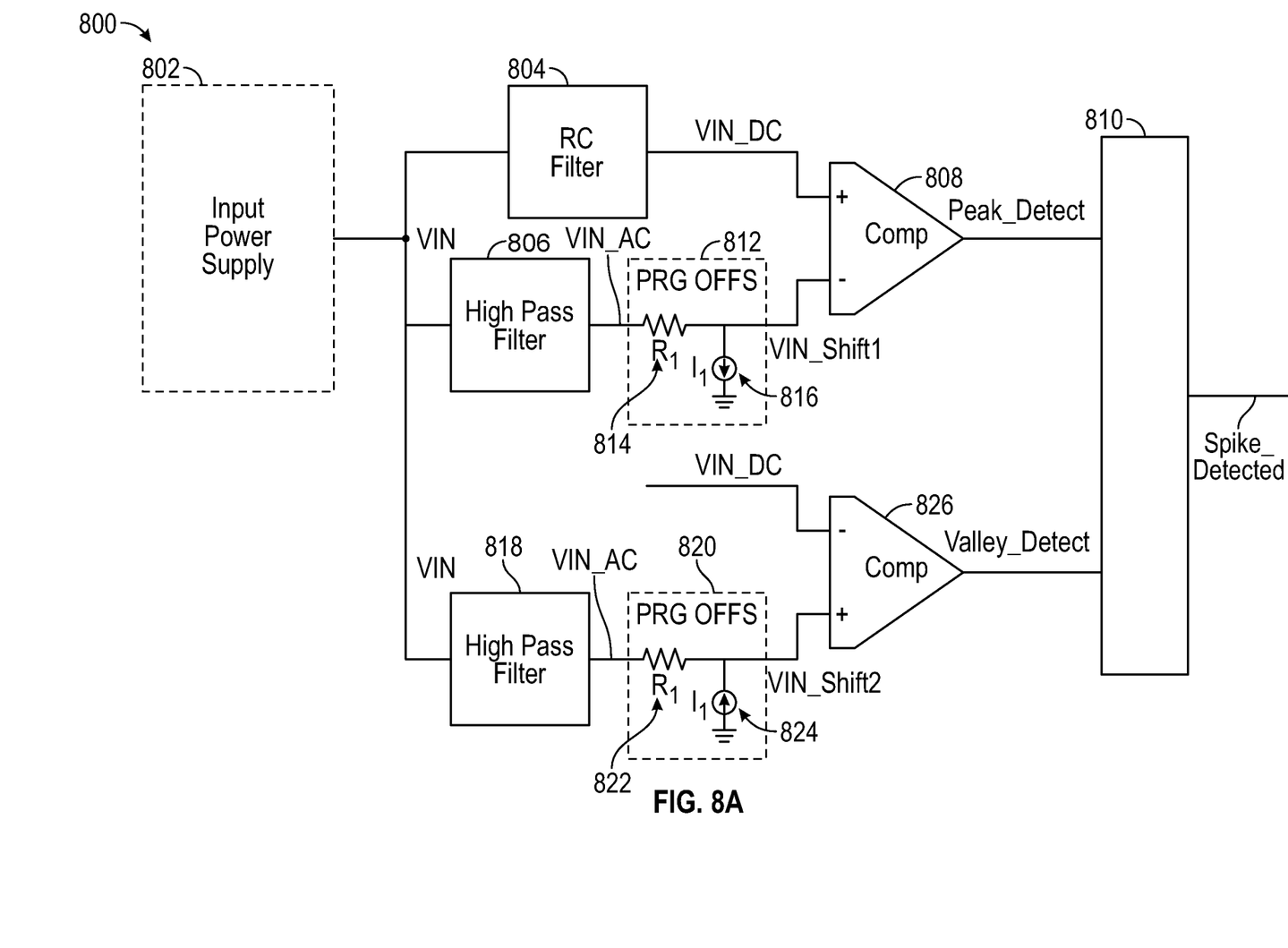
FIG. 8A illustrate a block diagram of an example portion of a frequency detection system to detect power supply spikes.

FIG. 8A illustrates a block diagram of an example portion of a frequency detection system 800 to detect power supply spikes. Power or voltage supply spikes may damage a component and may degrade component performance. The system 800 may include a power supply circuit 802, a first configurable filter 804, a second configurable filter 806, a comparator 808, a digital circuit 810, a first programmable offset generator 812, a third configurable filter 818, a second programmable offset generator 820, and a second comparator 826. The power supply circuit 402 may generate an input signal (VIN) to power electronic components. The frequency detection system 800 may include two branches to detect respective peaks and valleys in the input signal.

The first branch may detect peaks in the input signal. In the first branch, the power supply circuit 802 may be coupled to the first and second configurable filters 804, 806. The first configurable filter 804 may extract a direct-current (DC) or near-DC component (VIN_DC) (i.e., first range of frequencies) of the input signal. The first configurable filter 604 may be implemented as a passive or active filter. In this example, the first configurable filter 804 may be provided as RC filter with a specified cut of frequency (e.g., 2 KHz).

The second configurable filter 806 may extract a specified frequency range of an AC component (VIN_AC) of the input signal, as described above with reference to FIG. 1 (e.g., with respect to second configurable filter 106). In this example, the second configurable filter 806 may be implemented as a butterworth high pass filter (e.g., $5^{th}$ order) to extract a high frequency AC component of the input signal. For example, the cut-off frequency may be 1 MHz. An AC gain may also be set (e.g., 5).

The output of the second configurable filter 806 may be coupled to the first programmable offset generator 812. The first programmable offset generator 812 may shift the extracted AC component (VIN_AC) to generate a shifted signal (VIN_Shift1). For example, the first programmable offset generator 812 may include a resistor (R1) 614 and a programmable current digital-to-analog converter (IDAC I1) 816. The shifted signal may be represented as:

$$VIN_{Shift1} = VIN_{AC} - (R1 \times I1)$$

The comparator 808 may be coupled to the outputs of the first configurable filters 804 and first programmable offset generator 812. The comparator 808 may compare the extracted DC component (VIN_DC) and the shifted extracted AC component (VIN_Shift1) to generate a comparator output. The comparator 808 may operate as signal cross detector, such as a zero cross detector. The comparator output may go high at the crossing detection. Here the comparator output may be indicative of a detected peak in the input signal.

The second branch may detect valleys in the input signal. The second branch include a third configurable filter 818. In an example, the third configurable filter 818 may be provided as the same type of filter as the second configurable filter 806 in the first branch.

The output of the third configurable filter 818 may be coupled to the second programmable offset generator 820. The second programmable offset generator 820 may shift the extracted AC component (VIN_AC) to generate a second shifted signal (VIN_Shift2). For example, the second programmable offset generator 820 may include a resistor (R1) 822 and a programmable current digital-to-analog converter (IDAC I1) 824. The second shifted signal may be shifted in the opposite direction as the first shifted signal. The second shifted signal may be represented as:

$$VIN_{Shift2} = VIN_{AC} + R1 \times I1)$$

The second comparator 826 may compare the extracted DC component (VIN_DC) (which may be referenced from the first branch) and the shifted extracted AC component (VIN_Shift2) to generate a comparator output. The comparator 826 may operate as a zero cross detector. Here, the second comparator output may be indicative of a detected valley in the input signal.

The digital circuit 810 may be coupled to the output of the comparators 808, 826. The digital circuit 810 may detect the absence of a detected peak (peak_detect) or a detected valley (peak_valley). An absence of the detected peak or detected valley for a specified time duration may indicate a power supply circuit spike. For example, the digital circuit may start a spike_filter ramp at the detection of an absent peak or valley. If the absence continues for longer than the specified time, the spike_filter ramp may increase to a threshold level, indicating the presence of a power spike. The absence of a detected valley for the specified time duration may indicate an undershoot voltage spike, and the absence of the detected peak for the specified time duration may indicate an overshoot voltage spike.

Figure 8B:
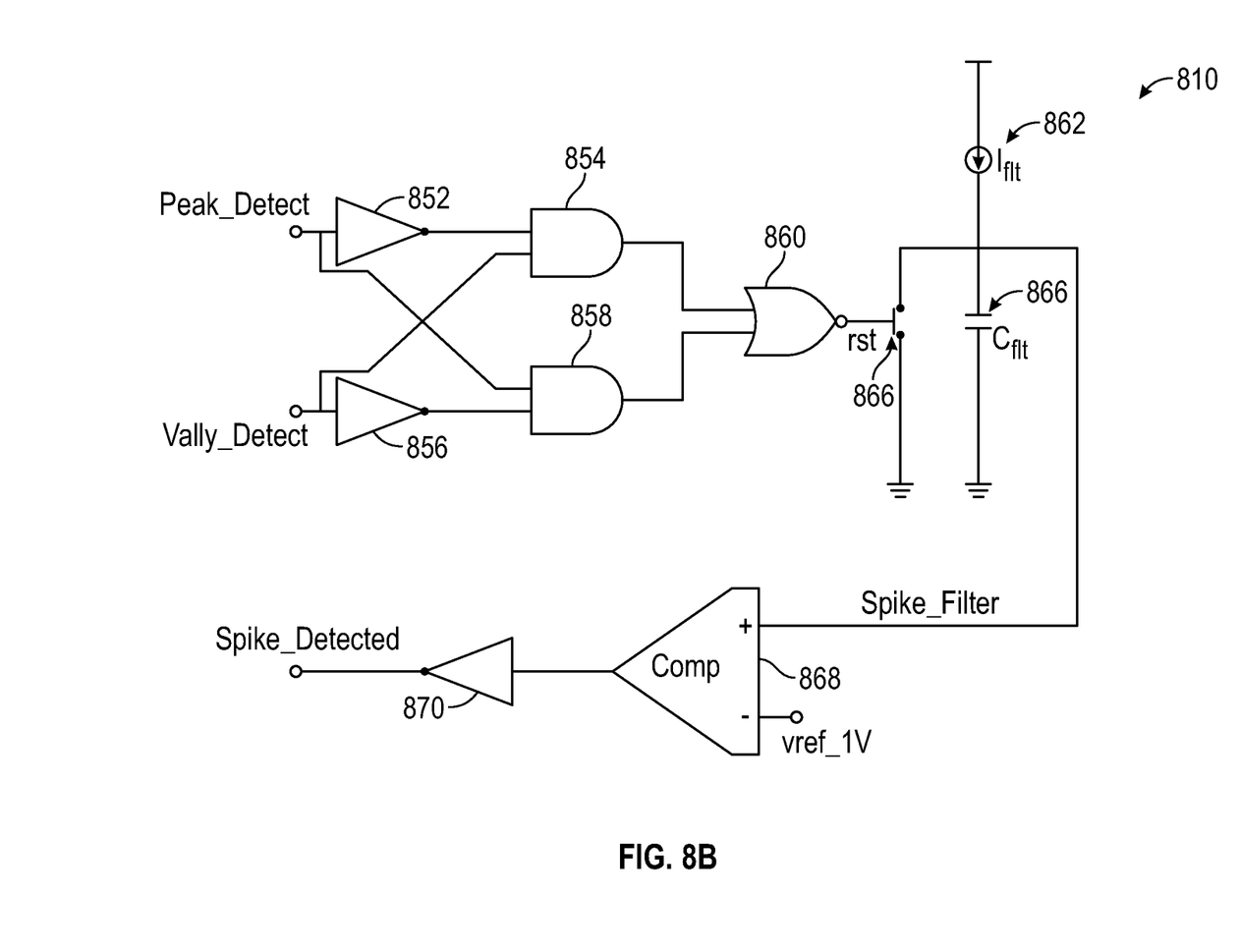
FIG. 8B illustrates a block diagram of an example portion of a digital circuit.

The digital circuit 810 may include a combination of logic circuits, switch(es), capacitor(s), current source(es), comparator(s), and voltage source(s). FIG. 8B illustrates a block diagram of an example portion of the digital circuit 810. For example, the digital circuit 810 may include a pair of NOT gates 852, 856; a pair of AND gates 854, 858, a NOR gate 860; a current source 862, a switch 864, a capacitor 866 to generate the spike_filter ramp. The spike_filter ramp may fed into a comparator 868 and a NOT gate 870 to generate the spike_detected output. In this example, if a spike duration time is larger than $$t = \frac{Cflt \times Vref_{1V}}{Iflt},$$

then a spike is detected. Cflt is a capacitance value of the capacitor 866, Iflt is the current value of the current source 862, and Vref_1V is a reference voltage.

Figure 9:
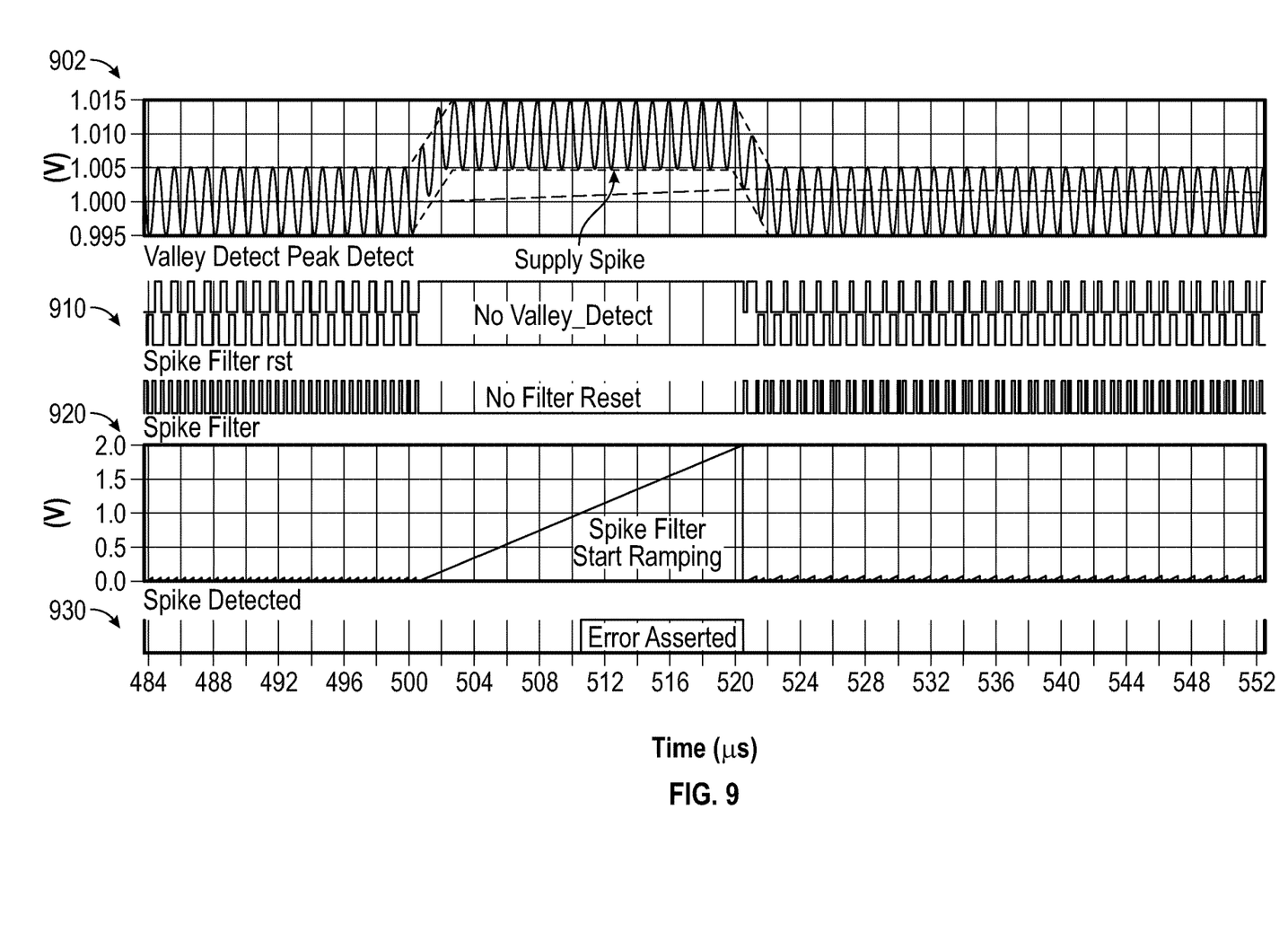
FIG. 9 illustrates example waveforms for detecting power supply spikes.

FIG. 9 illustrates example waveforms associated with system 800 of FIGS. 8A-8B configured to detect power supply spikes. Graph 902 shows the input signal VIN, the AC and DC components. As shown, the input voltage includes an overshoot voltage spike where the input voltage spikes up for a period of time. Graph 910 shows the outputs of the comparators—detected peak and detected valley. As shown, during the spike, the detected peak signal remains high while the detected valley signal remains low. The absence of the detected valley signal for the period of time indicates the presence of the overshoot voltage spike. Graph 920 shows the output of the spike_filter. Graph 930 shows the spike filter ramp. The spike_filter may start ramping up at the detection of the absence of the detected valley signal. If the absence persists for a specified time duration, an error is asserted, indicating a voltage spike in the power supply circuit.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A detector circuit for monitoring a power supply circuit output, the detector circuit comprising:
   a first configurable filter to extract a first component of an input signal corresponding to a first range of frequencies;
   a second configurable filter to extract a second component of the input signal corresponding to a second range of frequencies, the second range of frequencies extending to frequencies higher than the first range of frequencies;
   a programmable offset generator to shift a low frequency portion of the second component of the input signal;

a comparator to compare the first and second components to generate a comparator output; and a digital circuit to generate a value representative of a detected frequency of the input signal based on crossings detected at the comparator output.

2. The detector circuit of claim 1, wherein the digital circuit is configured to count a number of crossings at the comparator output and to scale the number of crossings by a time value to generate the detected frequency.

3. The detector circuit of claim 1, wherein the first configurable filter includes an RC filter and the first component is a DC or near-DC component.

4. The detector circuit of claim 1, wherein the second configurable filter includes a high pass filter to extract a high frequency portion of the second component of the input signal.

5. The detector circuit of claim 1, wherein the detected frequency provides information about a switching frequency of the input signal.

6. The detector circuit of claim 1, wherein the second configurable filter includes a low pass filter to extract a low frequency portion of the second component of the input signal.

7. The detector circuit of claim 1, wherein the detected frequency provides information about an output oscillation of the input signal.

8. The detector circuit of claim 1, wherein the detected frequency provides information about a ripple in the input signal.

9. The detector circuit of claim 1, further comprising:
a second comparator to generate information about one or more detected valleys of the input signal;
wherein the comparator output includes information about one or more detected peaks of the input signal, and
wherein the detected frequency provides information about a spike in the input signal.

10. A method comprising:
extracting a first component of an input signal;
extracting a second component of the input signal;
shifting a low frequency portion of the second component of the input signal;
detecting one or more crossings of the first and second components; and
based on the one or more crossings, calculating a value representative of detected frequency of the input signal, wherein the detected frequency provides information about a ripple in the input signal.

11. The method of claim 10, further comprising:
counting a number of crossings of the first and second components,
wherein calculating the detected frequency includes scaling the number of crossings by a time value.

12. The method of claim 10, further comprising extracting a high frequency portion of the second component of the input signal, wherein detecting one or more crossings includes detecting one or more crossings of the first component and the high frequency portion of the second component.

13. The method of claim 10, wherein the detected frequency provides information about a switching frequency of the input signal.

14. The method of claim 10, further comprising:
extracting a low frequency portion of the second component of the input signal, wherein detecting one or more crossings includes detecting one or more crossings of the first component and the low frequency portion of the second component.

15. The method of claim 10, wherein the detected frequency provides information about an oscillation of the input signal.

16. The method of claim 10, further comprising:
detecting one or more peaks of the input signal;
detecting one or more valleys of the input signal;
based on an absence of either the detected peaks or detected valleys for a time period, defining a spike in the input signal.

17. A method comprising:
extracting a first component of an input signal;
extracting a second component of the input signal;
detecting one or more crossings of the first and second components;
based on the one or more crossings, calculating a value representative of detected frequency of the input signal;
detecting one or more peaks of the input signal;
detecting one or more valleys of the input signal; and
based on an absence of either the detected peaks or detected valleys for a time period, defining a spike in the input signal.

18. The method of claim 17, further comprising:
counting a number of crossings of the first and second components,
wherein calculating the detected frequency includes scaling the number of crossings by a time value.

19. The method of claim 17, further comprising extracting a high frequency portion of the second component of the input signal, wherein detecting one or more crossings includes detecting one or more crossings of the first component and the high frequency portion of the second component.

20. The method of claim 17, wherein the detected frequency provides information about a switching frequency of the input signal.

* * * * *